United States Patent [19]

Elias et al.

[11] Patent Number: 4,761,332

[45] Date of Patent: Aug. 2, 1988

[54] PLANARIZED CERAMIC SUBSTRATES

[75] Inventors: Kenneth L. Elias, Essex Junction; Stuart R. Martin, Bristol; William J. Slattery, Essex Junction, all of Vt.

[73] Assignee: International Business Machines Corporation, Armonk, N.Y.

[21] Appl. No.: 937,265

[22] Filed: Feb. 24, 1987

Related U.S. Application Data

[62] Division of Ser. No. 747,598, Jun. 24, 1985, Pat. No. 4,659,585.

[51] Int. Cl.⁴ .................. B32B 18/00; B32B 9/00; B32B 19/00
[52] U.S. Cl. .................................... 428/325; 428/331; 428/404; 428/446; 428/698; 428/701
[58] Field of Search ............... 427/5, 39, 94, 126.2, 427/255, 255.2; 264/60, 61, 62; 428/325, 331, 404, 698, 701, 446; 501/97, 128, 154

[56] References Cited

U.S. PATENT DOCUMENTS

| | | | |
|---|---|---|---|
| 4,007,103 | 2/1977 | Baker et al. | 204/192.3 |
| 4,020,234 | 4/1977 | Gardner | 501/122 |
| 4,036,723 | 7/1977 | Schwartz | 204/192.22 |
| 4,118,539 | 10/1978 | Hirai et al. | 427/94 |
| 4,618,541 | 10/1986 | Forouhi et al. | 427/94 |
| 4,652,276 | 3/1987 | Burden | 501/154 |

Primary Examiner—Norman Morgenstern
Assistant Examiner—Margaret Burke
Attorney, Agent, or Firm—Francis J. Thornton; Theodore E. Galanthay

[57] ABSTRACT

A method of planarizing or smoothing the surface of a ceramic substrate by deposition of a silicon nitride layer. The silicon nitride in addition to planarizing the surface forms an alpha particle barrier. The substrates suitable for planarization with silicon nitride in accordance with the method of the present invention are sintered oxide particles which are bonded with a silicon bonding phase. The silicon content of the silicon bonding phase is greater than the silicon content of the aggregate of the oxide particles. The silicon nitride is preferably deposited by plasma enhanced chemical vapor deposition, and the silicon bonding phase is preferably a glass.

6 Claims, 1 Drawing Sheet

PLANARIZED CERAMIC SUBSTRATES

This is a division of application Ser. No. 747,598 filed June 24, 1985 now U.S. Pat. No. 4,659,585 issued Apr. 21, 1987.

BACKGROUND OF THE INVENTION

1. Field of the Invention

This invention relates to a method for planarizing the surface of ceramic substrates, in particular to vapor deposition of silicon nitride onto the surface of ceramic substrates; and to the planarized surface resulting from such deposition of silicon nitride.

2. Description of the Prior Art

Silicon nitride has been deposited onto semiconductor substrates and connection metallurgy to form conformal insulating layers. For example, U.S. Pat. No. 4,423,547 of Farrar et al. and assigned to the assignee of the present invention teaches a method for providing high density multiple level metallurgy for integrated circuit devices by plasma spraying a thin layer of silicon nitride over a layer of interconnection metallurgy. The '547 patent teaches a method for forming a passivating layer of silicon nitride. Vias can be etched in the silicon nitride layer and then a thick layer of a polyimide deposited. The deposition process of the '547 patent produces a conformal silicon nitride layer and does not planarize the substrate.

Planarizing the surface of ceramic substrates has been done by mechanical methods including grinding, lapping and polishing. These methods are time consuming, expensive, and in addition can not readily be done on selected regions of the substrate.

Glazing, which has been used to produce a planarized surface, like the mechanical methods listed above, is suited for planarizing the entire surface. Glasses used for glazing have low melting points and generally have elements added to depress the melting point such as calcium, sodium and potassium. These added elements are required to bring the melting point of the glaze below the melting point of the substrate. The glasses may also contain impurities such as lead, uranium and thorium. Since uranium and thorium are alpha emitters the glazing materials may be a source of alpha particles. In addition, glazing tends to form a surface with long wavelength variation and the edges of the glaze tend to round due to surface tension. Thus the usable planarized area resulting from glazing is limited. An additional disadvantage of glazes is that because of the brittle nature of the glasses used for glazing small cracks tend to propagate readily when the glazed surface is subject to stress such as may be encountered during fabrication. In addition the glazing process is inherently unsuitable for subsequent selective removal of the glaze. The glazing process is also difficult to control and extremely thick, in the order of 1 or more mils.

SUMMARY OF THE INVENTION

It is an object of this invention to provide a method of planarizing a ceramic surface with silicon nitride.

An object of this invention is to planarize the surface of ceramic substrates prior to metal deposition.

Another object of the invention is to form an alpha barrier.

It is still another object of this invention to provide a method which allows for selective planarization of a ceramic surface.

Still a further object of this invention is to provide a planarized ceramic surface for subsequent deposition of metal.

A further object of the invention is to provide an alpha barrier which preferentially deposits over the glass phase of a ceramic substrate, the glass phase being an alpha particle emitter.

These and other objects of the invention are provided by chemical vapor deposition of silicon nitride onto a ceramic substrate. It is preferred that the deposition be by plasma enhanced chemical vapor deposition.

Plasma enhanced chemical vapor deposition of silicon nitride can be used to planarize ceramic semiconductor substrates which are composed of oxides bonded with a silicon bearing bonding phase. Typical oxides used for the substrates are metal oxides such as aluminum oxide, beryllium oxide, zirconium oxide and magnesium oxide; and metal silicon oxides such as forsterite ($Mg_2SiO_4$), mullite ($Al_6Si_2O_{13}$), and cordierite ($Al_4Mg_2Si_5O_{18}$) and mixtures thereof. In order to assure preferential deposition of silicon nitride onto the bonding phase it is preferred that the bonding phase have a silicon dioxide content of between about 70 wt/o and 95 wt/o, and in all cases that the silicon content of the bonding phase be greater than the silicon content of the aggregate of the oxide particles. The silicon bearing bonding phase may be a glass.

These and other objects, features and advantages of the invention will be apparent from the following more particular description of the preferred embodiments of the invention as illustrated in the accompanying drawings.

DESCRIPTION OF THE PREFERRED EMBODIMENTS

Figure 1:
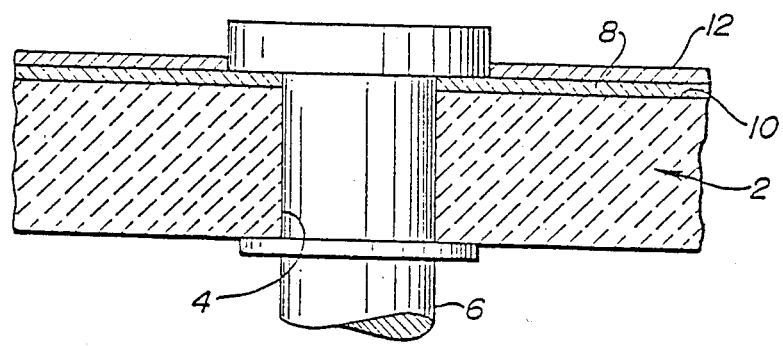
FIG. 1 is a schematic representation of one embodiment of the present invention and illustrates a pressed and sintered ceramic substrate onto which silicon nitride and connection metallurgy have been deposited.

FIG. 1 is a schematic representation of one embodiment of the present invention illustrating a ceramic substrate 2 composed of oxide particles which are bonded with a silicon bearing glass. Since some oxides, for example aluminum oxide, can contain impurities such as uranium which is an alpha emitter, oxides with low levels of alpha emitting contaminants are preferred. A hole 4 is provided which passes through the substrate 2. An I/O pin 6 is placed through the hole 4. Silicon nitride 8 is deposited onto the surface 10 of the substrate 2 prior to positioning of the I/O pin 6. Metallurgical structure 12 is deposited on the silicon nitride 8 and connected to the I/O pin 6 by lithographic techniques.

Figure 2:
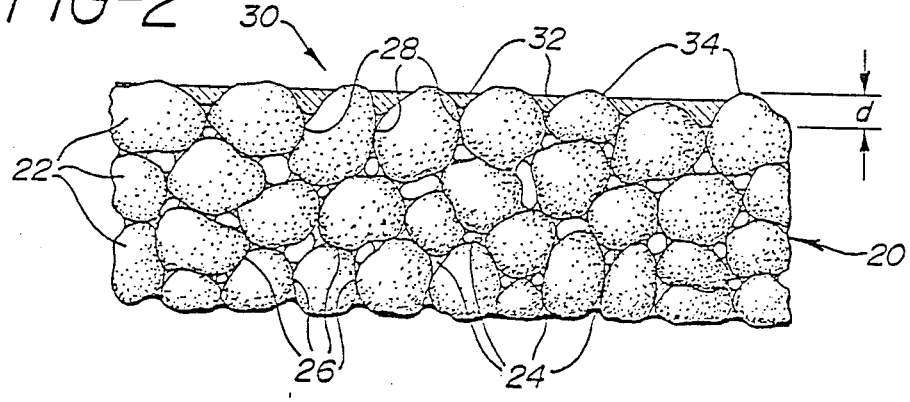
FIG. 2 is a schematic representation of a sintered ceramic substrate illustrating the bonding of the oxide particles by a glass bonding phase, and the distribution of silicon nitride which has been deposited by the method of the present invention.

FIG. 2 is a schematic representation showing details of the structure of a ceramic substrate 20. The ceramic substrate 20 is composed of oxide particles 22 which are bonded by a glass phase 24. The glass phase 24 is preferentially located at junctions 26 of the oxide particles 22. The surface junctions 28 form the low points on the surface 30 of the ceramic substrate 20. The silicon bearing glass frequently contains impurities such as lead, uranium and thorium, with uranium and thorium being alpha particle emitters. Thus the surface junctions 28 may be preferential sources of alpha emission. The surface junctions 28 are associated with relatively large exposed surface of the oxide particles 22. Thus the surface junctions 28 may be sites of additional alpha emissions if the oxide particles contain alpha emitters.

When silicon nitride 32 is deposited onto the ceramic substrate 20 the silicon nitride preferentially deposits onto the silicon bearing glass phase 24 located at the surface junctions 28.

It is prefered that the substrate 20 be composed of metal oxide particles such as aluminum oxide, beryllium oxide, magnesium oxide, zirconium and/or mixtures thereof bonded with a silicon bearing glass. It is further preferred that the silicon dioxide content of the silicon bearing glass be approximately 70 wt/o to 95 wt/o and that the silicon be limited to the glass phase. Having silicon only in the glass phase maximizes the preferential deposition of the silicon nitride layer 8 onto the glass phase.

It is further preferred that plasma enhanced chemical vapor deposition be employed for depositing the silicon nitride. Plasma enhanced chemical vapor deposition is preferred since lower deposition temperatures can be employed while assuring enhanced preferential filling of the junctions 28 on the surface 30 of the ceramic substrate 20. The preferential filling of the low points adjoining the surface junctions 28 on the surface 30 results in planarizing the surface.

As a result of the preferential filling of the low points of the surface 30 by silicon nitride, portions 34 of the oxide particles 22 on the surface remain exposed. It is preferred that the mean thickness of the silicon nitride deposited on the surface 30 be less than the mean depth d of the low points adjoining the surface junctions 28 since this assures that regions 34 of the particles 22 will remain exposed. The exposed regions 34 of the oxide particles 22 provides sites for the attachment of the conductive metallurgy deposited subsequent to the deposition of the silicon nitride. The deposition of silicon nitride onto the surface 30 of the substrate 20 can be indexed by co-depositing silicon nitride onto a silicon wafer and measuring the thickness of the coating deposited on the silicon wafer. For typical ceramic substrates which have a surface roughness, as indexed by centerline averages, of between about 25 microinches (0.625 microns) and 50 microinches (1.25 microns) the thickness of the silicon nitride layer on a co-deposited silicon wafer should be between about 1 and 4 microns, and it is preferred that the silicon nitride layer be at least 1.5 microns.

In one preferred embodiment chromium is used as the first layer of connective metallurgy and a sintered aluminum oxide is employed for the substrate. The deposited chromium will form a chromium oxide which in turn reacts with exposed aluminum oxide particles. This reaction bonds the chromium layer to the ceramic substrate.

In addition to planarizing the surface, silicon nitride serves as an alpha particle barrier and blocks alpha particles emitted by surface junctions 28. The thickness of the alpha particle barrier will depend on the level of the alpha particle emissions. For typical ceramic substrates a silicon nitride layer having a thickness of between about 1.5 and 4 microns will serve as an effective alpha barrier.

Another advantage of using silicon nitride to planarize the ceramic substrate is that the silicon nitride layer can be patterned subsequent to deposition onto the substrate. A mask can be overlayed on the silicon nitride leaving regions of the silicon nitride exposed which can be removed by etching and in this manner the substrate can be regionally planarized. Regional planarization can not be readily accomplished by either mechanical techniques or glazing. Further, since glazing materials frequently contain impurities which emit alpha particles, when the surface is planarized by glazing the surface may become an alpha particle emitter. The silicon nitride of the present invention serves as an alpha barrier.

Figure 3:
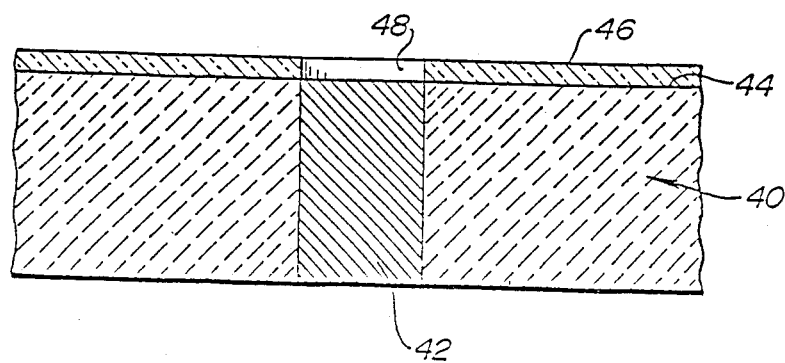
FIG. 3 is a schematic representation of a ceramic substrate that has embedded therein a metallic conductive channel. Silicon nitride has been deposited in accordance with the method of the present invention and a hole has been etched through the silicon nitride to expose the metallic conductive channel.

FIG. 3 shows a schematic representation of a ceramic substrate 40 having a metallic conductor 42 which passes through the substrate 40. When the surface 44 of the substrate 40 is planarized with silicon nitride 46 the metallic conductor 42 will have silicon nitride deposited thereon. After deposition of the silicon nitride 46 a plasma etch can be used to remove silicon nitride from the regions 48 on the metallic conductor 42 before connection metallurgy is deposited.

The use of silicon nitride for planarizing provides for a smoother surface and allows finer metallic lines to be employed. The following examples are given to illustrate the benefits from planarizing by deposition of silicon nitride onto a ceramic substrate.

EXAMPLE I

Silicon nitride was deposited onto an aluminum oxide substrate having about 4 wt/o of a silicon bearing glass bonding phase. The glass bonding phase was approximately 95 wt/o silicon dioxide. The substrate had an average surface finish of 35 microinches and an average peak to valley depth of 296 microinches. The silicon nitride was deposited to an average depth of 60 microinches which corresponded to a 1.5 micron layer co-deposited onto a silicon wafer. The silicon nitride was applied by plasma enhanced chemical vapor deposition. Prior to deposition the substrate was preheated to 375° C. in a tube furnace having a 6 inch diameter and a length of 5 feet. The furnace was maintained at a pressure of between 2 and 4 Torr. Silane and ammonia gases were fed into the chamber at the rates of 350 cc/min and 3500 cc/min respectively. An RF power of 125 watts was applied. The deposition time was approximately 90 minutes. After coating the average surface finish was 11 microinches and the average peak to valley depth was 132 microinches. This represents a 68% and a 55% reduction respectively in surface roughness characteristics.

EXAMPLE II

A metallizing structure was deposited onto an aluminum oxide substrate having about 4 wt/o a silicon bearing glass bonding phase. The glass bonding phase was approximately 95 wt/o silicon dioxide. The substrate was coated wtih a chromium adhesive layer, a copper layer and a second chromium layer. The substrate had an average surface finish of 25 microinches and an average peak to valley depth of 243 to 248 microinches. The three layer metallized structure of chromium, copper and chromium had thicknesses of about 80 nm, 8000 nm and 300 to 600 nm respectively. The base pressure in the sputtering chamber was $2\times10^{-6}$ Torr with an argon pressure of 10 microns at 130 sccm. The substrate was preheated to 300° C. to 20 minutes prior to sputtering.

The target power for the chromium deposition was 600 Watts DC with a substrate bias of 0 V. The target power for the copper deposition was 11 KW DC with a substrate bias of 0 V. After sputtering the combined thickness of the deposited metal layer was 340 microinches, the surface finish was 24 microinches, and the peak to valley depth was 229 to 239 microinches.

Example I illustrates the smoothing effect resulting from depositing silicon nitride onto a ceramic substrate, while Example II illustrates that the use of a metallizing structure is ineffective in smoothing a ceramic substrates even when the deposited layer is relatively thick.

While the novel features of this invention have been described in terms of preferred embodiments and particular applications, it will be appreciated that various omissions and substitutions in form of the present invention may be made by those skilled in the art without departing from the spirit of the invention.

What is claimed is:

1. A ceramic substrate comprising:
    a ceramic sheet containing oxide particles selected from the group consisting of aluminum oxide, beryllium oxide, magnesium oxide, zirconium oxide, cordierite, forsterite, mullite, and mixtures thereof; said oxide particles being bonded with a silicon bearing phase; and
    an overlay of silicon nitride on said ceramic sheet preferentially deposited on said silicon bearing bonding phase.

2. The substrate of claim 1 wherein said silicon nitride is deposited by plasma enhanced chemical vapor deposition.

3. The ceramic substrate of claim 1 wherein said oxide particles are aluminum oxide and the silicon bearing phase is a glass.

4. The ceramic substrate of claim 1 wherein said silicon nitride covers selected regions of said ceramic sheet.

5. The ceramic substrate of claim 1 wherein the overlay of silicon nitride leaves portions of said oxide particles exposed.

6. A ceramic substrate of claim 1 wherein:
    said a ceramic sheet comprises by weight approximately 96% aluminum oxide and 4% glass bonding phase; and
    said overlay of silicon nitride is applied by chemical vapor deposition.

* * * * *